(12) United States Patent
Kwon et al.

(10) Patent No.: US 7,838,380 B2
(45) Date of Patent: Nov. 23, 2010

(54) METHOD FOR MANUFACTURING PASSIVE DEVICE AND SEMICONDUCTOR PACKAGE USING THIN METAL PIECE

(75) Inventors: Young-Se Kwon, Daejeon (KR); Kyoung-Min Kim, Seoul (KR)

(73) Assignee: Wavenics Inc., Daejeon (KR)

( * ) Notice: Subject to any disclaimer, the term of this patent is extended or adjusted under 35 U.S.C. 154(b) by 0 days.

(21) Appl. No.: 12/695,449

(22) Filed: Jan. 28, 2010

(65) Prior Publication Data

US 2010/0144099 A1 Jun. 10, 2010

Related U.S. Application Data

(62) Division of application No. 11/912,178, filed as application No. PCT/KR2005/002940 on Sep. 6, 2005, now Pat. No. 7,696,055.

(30) Foreign Application Priority Data

Apr. 21, 2005 (KR) ............... 10-2005-0033011

(51) Int. Cl.
*H01L 21/20* (2006.01)
(52) U.S. Cl. ............... 438/381; 438/108; 438/118; 257/E23.02; 257/E27.009
(58) Field of Classification Search ............... 438/381, 438/108, 118; 257/E23.02, E27.009
See application file for complete search history.

(56) References Cited

U.S. PATENT DOCUMENTS

| | | | |
|---|---|---|---|
| 5,672,548 A | 9/1997 | Culnane et al. | |
| 6,169,319 B1 * | 1/2001 | Malinovich et al. | 257/447 |
| 6,476,476 B1 | 11/2002 | Glenn | |
| 6,495,912 B1 | 12/2002 | Huang et al. | |
| 6,717,819 B1 * | 4/2004 | Chung | 361/760 |
| 6,876,056 B2 | 4/2005 | Tilmans et al. | |
| 2002/0185738 A1 | 12/2002 | Kim et al. | |
| 2003/0003741 A1 * | 1/2003 | Ueda et al. | 438/689 |
| 2003/0071326 A1 | 4/2003 | Lin | |
| 2004/0171190 A1 * | 9/2004 | Nishitani et al. | 438/106 |
| 2004/0264837 A1 * | 12/2004 | Ogawa | 385/14 |
| 2005/0056931 A1 * | 3/2005 | Ogawa | 257/728 |
| 2005/0176236 A1 * | 8/2005 | Lee et al. | 438/618 |
| 2005/0212137 A1 * | 9/2005 | Yamamoto et al. | 257/758 |
| 2005/0253257 A1 | 11/2005 | Chiu et al. | |

* cited by examiner

*Primary Examiner*—Thanh V Pham
*Assistant Examiner*—Duy T Nguyen
(74) *Attorney, Agent, or Firm*—Gifford, Krass, Sprinkle, Anderson & Citkowski, P.C.

(57) ABSTRACT

A method for manufacturing passive devices and semiconductor packages using a thin metal piece is provided. According to the method, an adhesive layer is formed on a dummy substrate; a thin metal piece is bonded on the adhesive layer; a masking material is attached to the thin metal piece, a dielectric layer is formed; a masking material is attached to form metal pads; a metal pad is formed, and the formed device is attached to a lower substrate using the metal pads; the adhesive layer and the dummy substrate are removed, a masking material is attached on a surface exposed, a region where passive devices are to be formed is patterned, and the thin metal piece is etched at a predetermined depth; and solder bumps for surface mounting are formed.

7 Claims, 4 Drawing Sheets

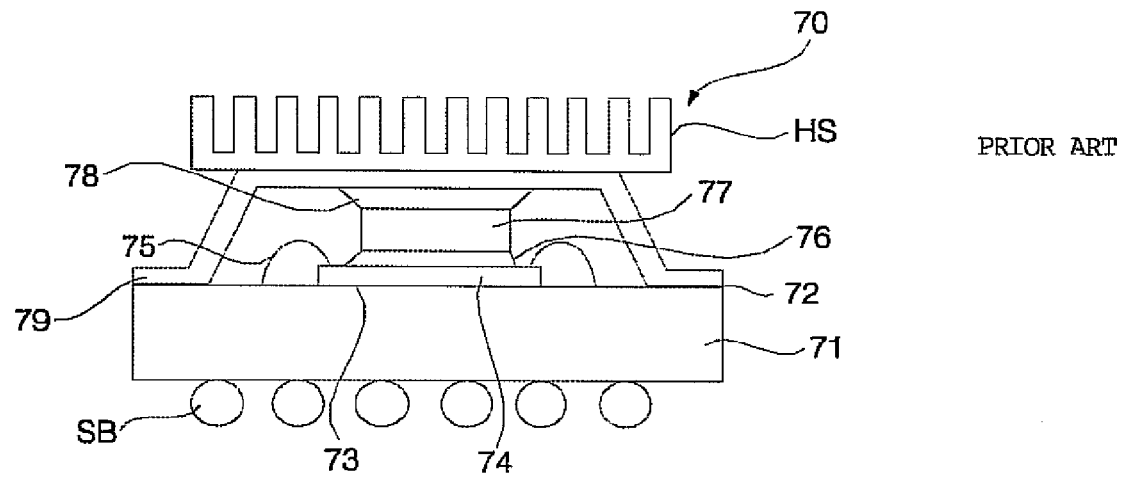
[Fig. 1]
PRIOR ART
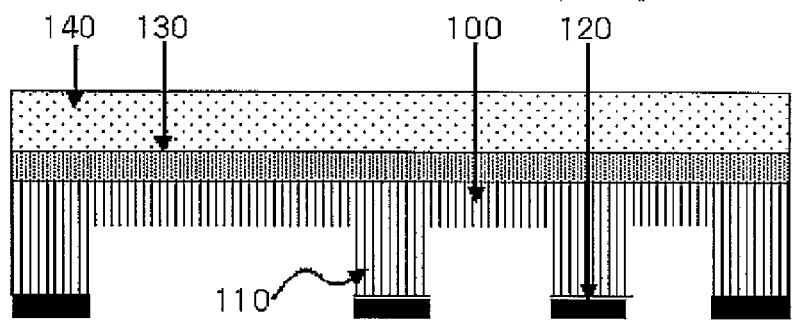
[Fig. 2]
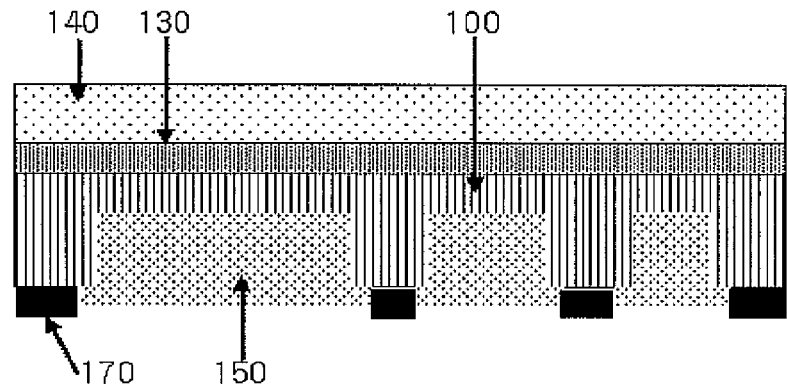
[Fig. 3]
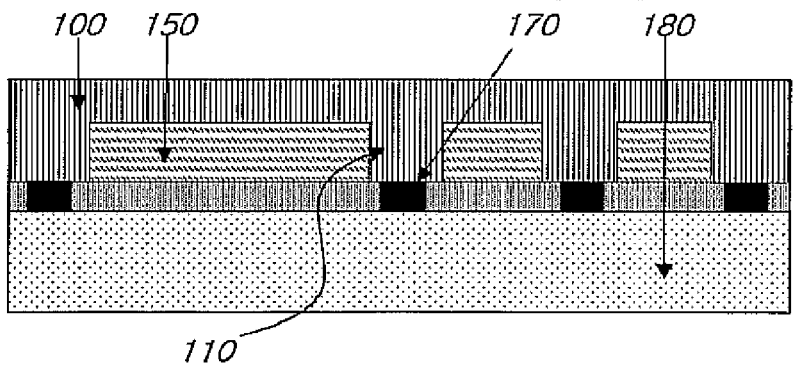
[Fig. 4]

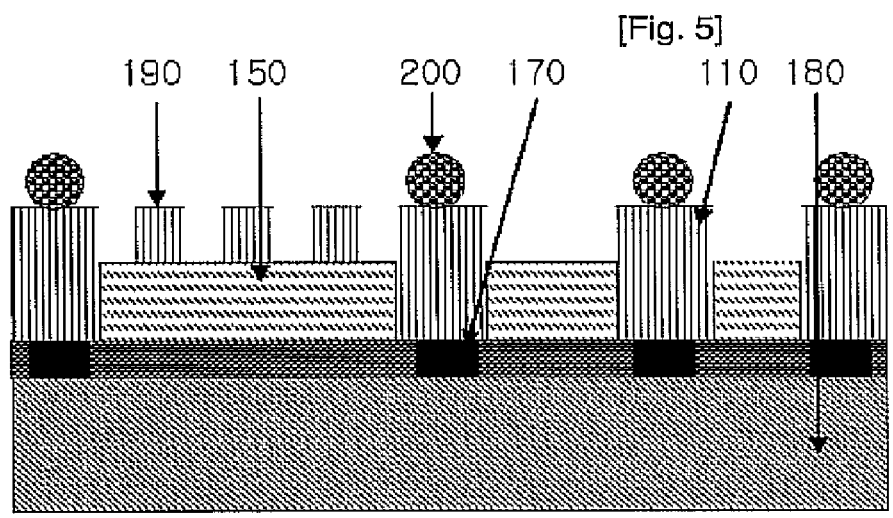
[Fig. 5]
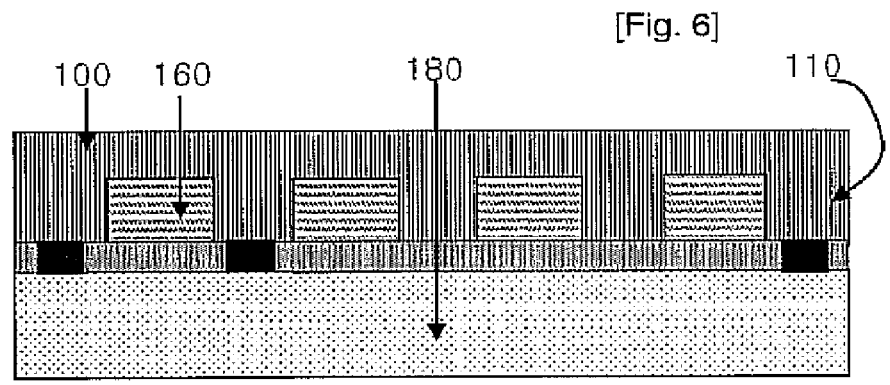
[Fig. 6]
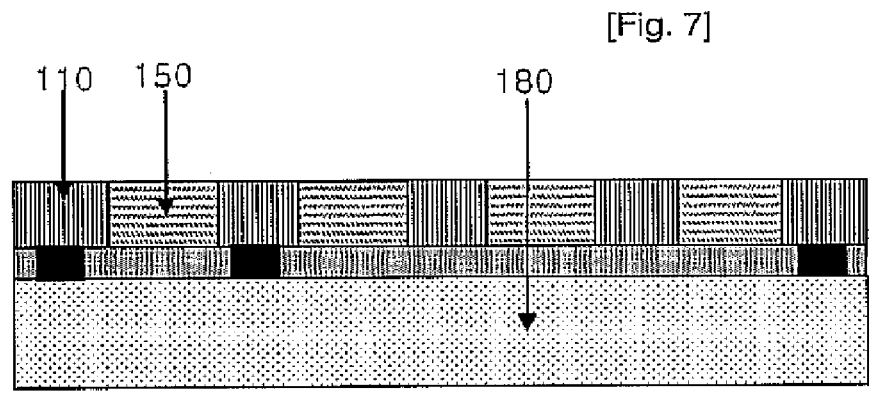
[Fig. 7]
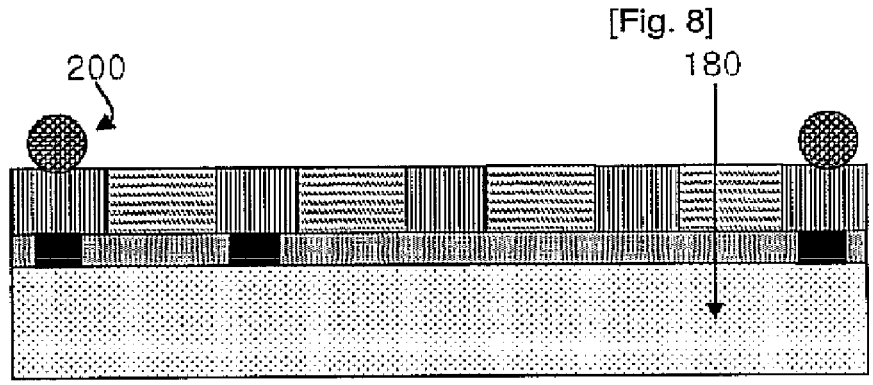
[Fig. 8]

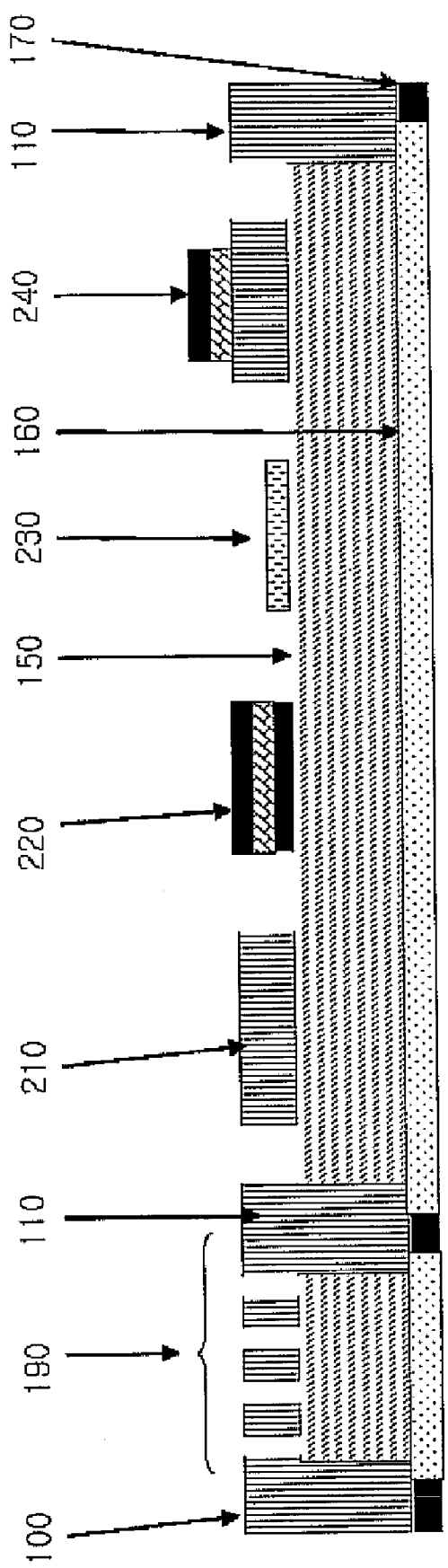
[Fig. 9]

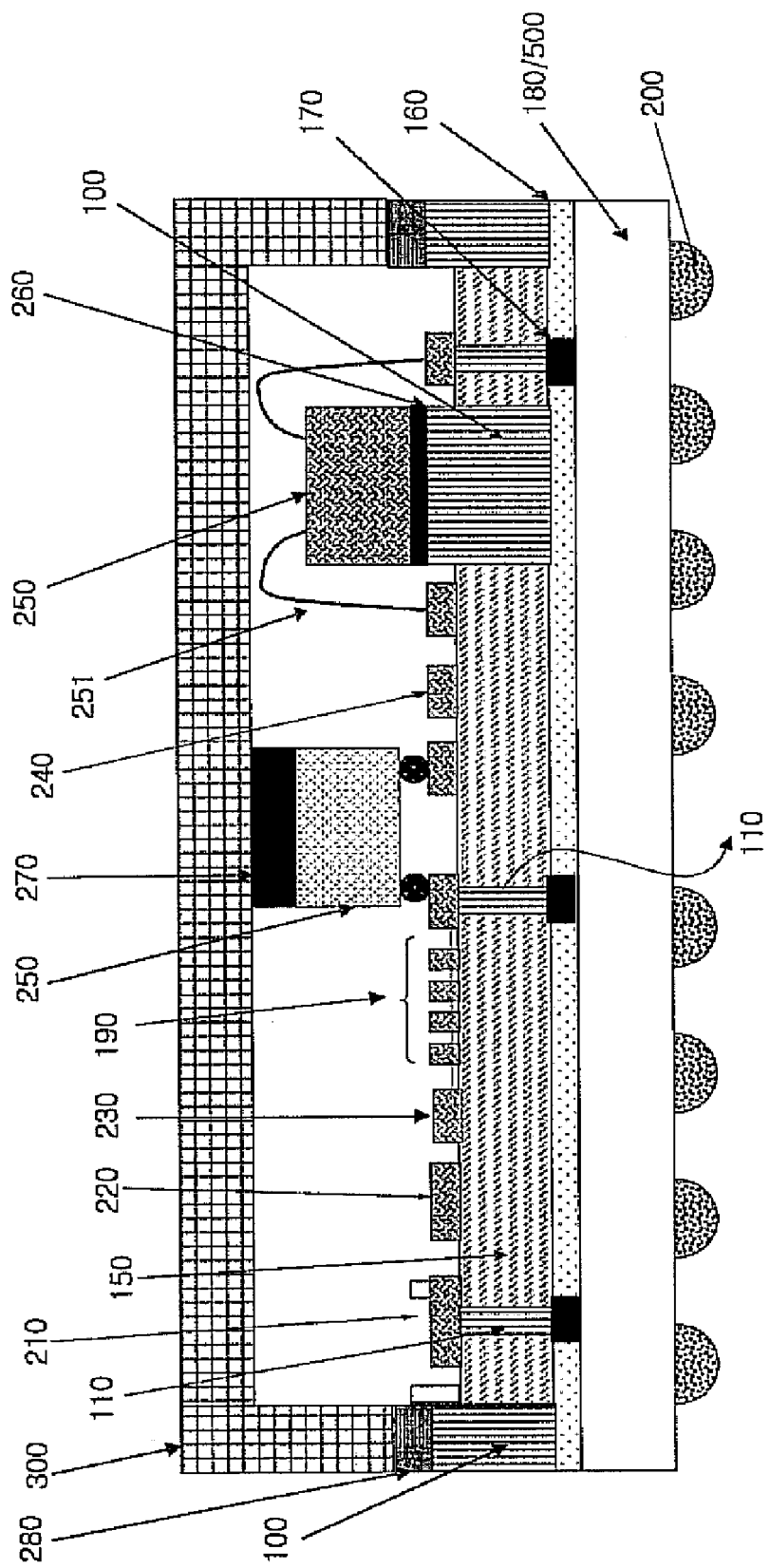
[Fig. 10]

METHOD FOR MANUFACTURING PASSIVE DEVICE AND SEMICONDUCTOR PACKAGE USING THIN METAL PIECE

CROSS-REFERENCE TO RELATED APPLICATIONS

This application is a divisional of U.S. patent application Ser. No. 11/912,178 filed Oct. 22, 2007, which is a 371 of PCT/KR2005/002940 filed Sep. 6, 2005, which claims priority of Korean Patent Application 10-2005-0033011 filed Apr. 21, 2005.

BACKGROUND OF THE INVENTION

1. Field of the Invention

The present invention relates to a method for manufacturing passive devices and packages using a thin metal piece, and more particularly, to a method for manufacturing passive devices and semiconductor packages capable of manufacturing passive devices required for a system construction on a thin metal piece containing a dielectric layer, effectively emitting heat by attaching semiconductor devices in a bare-chip state on a thin metal piece using a flip-chip bonding or a wire-bonding, and selectively integrating the passive devices having excellent electrical property even in ultrahigh frequency waves on the thin metal piece containing a dielectric layer.

2. Description of the Related Art

Generally, one of important properties required for a semiconductor package is a heat emission property. Particularly, as semiconductor devices are high-speed and high-power oriented recently, much researches and developments are being carried out so as to deal with high heat generation.

FIG. 1 is a sectional view of a semiconductor package for heat emission according to an embodiment of a related art. First, a substrate 71 having a plurality of solder balls (SB) formed on a lower portion thereof and a metal cap 79 for sealing an upper surface of the substrate 71 using a sealant 72 are prepared, respectively. At this point, the substrate 71 is made of one of a printed circuit board (PCB), a ceramic substrate, and a silicon substrate for being applied to a semiconductor package such as a pin grid array (PGA) type, a land grid array (LGA) type, and a ball grid array (BGA) type.

Next, after a semiconductor chip 74 is mounted on a die pad 73 of the substrate 71, a bonding pad of the semiconductor chip 74 is electrically connected with an electrode pad of the substrate 71 using a bonding wire 75. At this point, a tape automated bonding (TAB) can be applied as the bonding means instead of the electrical connection using the bonding wire 75.

Next, when the wire bonding is completed by the bonding means, an adhesive 76 for bonding a heat spreader on an upper surface of the semiconductor chip 74 is spread on the upper surface. At this point, the adhesive 76 should not have an influence on the surface of the semiconductor substrate 74 and should appropriately support the heat spreader 77.

The heat spreader 77 of a flat type is mounted on the adhesive 76. At this point, the heat spreader 77 is mounted between the upper surface of the adhesive 76 and a thermal compound 78.

Here, the heat spreader 77 is made of one material selected from the group consisting of copper having high thermal conductivity, copper alloy, aluminum, aluminum alloy, steel, and stainless steel.

Next, the upper surface of the substrate 71 is sealed by the metal cap 79. The thermal compound 78 is dotted between the heat spreader 77 and the metal cap 79 before the upper surface is sealed by the metal cap 79, so that adhesiveness or thermal diffusion improves.

Thus, the substrate 71 and the metal cap 79 are sealed by the sealant 72. When the sealant 72 is hardened, the thermal compound is also hardened.

After that, a heat sink (HS) of a fin shape is attached on the upper surface of the metal cap 79 so that high heat may be easily emitted, and the manufacturing of the semiconductor package for heat emission is completed.

The related art semiconductor package for heat emission can improve an heat-emission effect more or less using the metal cap, but substrates such as PCBs on which passive devices (inductors, capacitors, resistors, transmission lines), passive circuits, semiconductors are mounted are plastic substrates or ceramic substrates having low thermal conductivity, so that such substrates have a problem of not effectively emitting heat transferred from the devices to the surface of the substrate.

SUMMARY OF THE INVENTION

Accordingly, the present invention is directed to a method for manufacturing passive devices and semiconductor packages using a thin metal piece capable of providing high quality passive devices having high electrical conductivity and reducing manufacturing time and costs by selectively etching and polishing the thin metal piece to simultaneously form passive devices such as high quality inductors and vias using a semiconductor process.

An object of the present invention is to provide a method for manufacturing passive devices and semiconductor packages using a thin metal piece capable of effectively emitting heat by manufacturing passive devices (capacitors, resistors, inductors, and transmission lines) required for a system construction on a metal surface or a polymer layer and attaching a plurality of semiconductor devices in a bare-chip state on a thin metal piece using a flip-chip bonding or a wire-bonding.

Another object of the present invention is to provide a method for manufacturing passive devices and semiconductor packages using a thin metal piece capable of forming thin metal pieces in the form of BGA or LGA using etching and polishing processes so that the thin metal pieces can be surface-mounted on a substrate such as a PCB instead of using a conventional lead frame where much parasitic components are generated at a high frequency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing passive devices including inductors and vias formed on a substrate in an integration manner using a thin metal piece, the method including the steps of: forming an adhesive layer on a dummy substrate; bonding a thin metal piece on the adhesive layer; attaching a masking material to the thin metal piece, patterning a region where vias are to be formed, and etching the thin metal piece at a predetermined depth; removing the masking material, filling the etched portion with polymer to form a flat polymer layer, attaching the masking material on the polymer layer, pattering a region that is to be attached to an integrated passive devices (TPD) or an integrated circuit (IC) chip, forming a metal pad, and attaching the formed devices to a lower substrate including the IPD and the IC chip using the metal pad; removing the adhesive layer and the dummy substrate, attaching a masking material on a surface exposed after the dummy substrate of the thin metal piece is removed, patterning a region where passive devices including inductors and vias are to be formed, and etching the thin metal piece at a predetermined depth; and forming solder bumps for surface-mounting after removing the masking material.

Another aspect of the present invention provides a method for manufacturing passive devices formed on a metal substrate in an integration manner using a thin metal piece, the method including the steps of: forming an adhesive layer on a dummy substrate; bonding a thin metal piece on the adhesive layer; attaching a masking material on a backside of the thin metal piece, patterning regions where the passive devices are to be formed, and forming an insulator at a predetermined depth in a predetermined region of the thin metal piece; removing the masking material, forming a metal pad on the backside of the thin metal piece using photolithograph; attaching the formed devices to a lower substrate including an IPD and an IC chip using the metal pad; removing the adhesive layer and the dummy substrate; removing metal in a surface of the thin metal piece until the insulator is exposed; and forming solder bumps on a PCB for a surface-mounting.

Still another aspect of the present invention provides a method for manufacturing semiconductor packages using a thin metal piece, that integrates passive devices on a thin metal piece and protects a surface of the passive devices using a metal cover, the method including the steps of: integrating passive devices required for realizing a system on a dielectric or a metal surface of the thin metal piece where the passive devices are realized, connecting semiconductor devices in a bare-chip state with the integrated passive devices using a flip-chip bonding; forming a solder bump for a surface-mounting below the lower substrate; and bonding on the thin metal piece the metal cover for protecting the passive devices and the semiconductor devices integrated on the thin metal piece.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a sectional view of a related art semiconductor package for heat emission according to an embodiment of the present invention;

FIGS. 2 to 5 are views illustrating processes for forming passive devices using a thin metal piece according to a first embodiment of the present invention;

FIGS. 6 to 8 are views illustrating processes for forming passive devices using a thin metal piece according to a second embodiment of the present invention;

FIG. 9 is a sectional view of passive devices that uses a thin metal piece according to a third embodiment of the present invention; and FIG. 10 is a sectional view of a semiconductor package that uses a thin metal piece according to a fourth embodiment of the present invention.

DETAILED DESCRIPTION OF THE INVENTION

Reference will now be made in detail to the preferred embodiments of the present invention, examples of which are illustrated in the accompanying drawings.

FIGS. 2 to 5 are views illustrating processes for forming passive devices using a thin metal piece according to a first embodiment of the present invention.

First, a thin metal piece 100 is boned on a backside of a dummy substrate 140 having excellent flatness using an adhesive layer 130. Masking material 120 such as $SiO_2$ or $SiN_x$ is attached on a backside of the thin metal piece 100, regions where vias 110 are to be formed are patterned, the backside of the thin metal piece 100 is etched at a predetermined depth. At this point, the etching may be performed using a chemical etching.

Next, the masking material 120 is removed and a polymer layer 150 made of a material such as benzocyclobutene (BCB), polyimide (PI), bismaleimide triazine (BT) is formed on the entire backside of the thin metal piece.

After that, referring to FIG. 3, the polymer layer 150 below the regions where the vias 110 are to be formed is removed using a photolithography and metal pads 170 are formed. The formed devices are attached on a lower substrate 180 such as an IPD and an IC chip, and the adhesive layer 130 and the dummy substrate 140 having excellent flatness are removed, so that a shape illustrated in FL 4 can be obtained.

Next, a masking material (not shown) is deposited on an upper surface of the thin metal piece 100, i.e., an exposed surface where the polymer layer 150 is not formed, regions where passive devices such as inductors 190 and vias 110 are to be formed are patterned, and then the thin metal piece 100 is etched at a predetermined depth.

After that, the masking material is removed and solder bumps 200 for surface-mounting are formed on required regions, so that the passive devices are finally manufactured. In FIG. 5, the passive devices can be manufactured in the structure where the lower substrate 180 is omitted, if necessary.

FIGS. 6 to 8 are views illustrating processes for forming passive devices using a thin metal piece according to a second embodiment of the present invention.

First, a thin metal piece 100 is bonded on a backside of a dummy substrate 140 having excellent flatness using an adhesive layer 130 as in FIG. 2 illustrating the first embodiment. With a masking material 120 such as $SiO_2$ and $SiN_x$ attached on a backside of the thin metal piece 100, regions where insulators 160 are to be formed are patterned. After that, the insulators 160 are formed at a predetermined depth in required regions of the thin metal piece 100 as illustrated in FIG. 6. At this point, an ion implantation or an anodization is used so as to form the insulators 160 in the required regions.

When the formed devices are attached on a lower substrate such as an IPD and an IC chip and the adhesive layer 130 and the dummy substrate 140 having excellent flatness are removed, a shape illustrated in FIG. 6 can be obtained.

Now, description will be made for processes different from the first embodiment. Metal in an upper surface of the thin metal piece 100, namely, an exposed surface where the insulators 160 are not formed is removed using a mechanical lapping/polishing, a chemical etching, or a mechanical/chemical composite etching until the insulators 160 are exposed.

After that, solder bumps 200 of a BGA type or a LGA type are formed on an upper portion so that surface-mounting can be performed on a PCB. Even in that case, the devices can be manufactured in the structure where the lower substrate 180 is omitted, if necessary.

FIG. 9 is a sectional view of passive devices that uses a thin metal piece according to a third embodiment of the present invention.

In FIG. 9, after inductors 190 and vias 110 are selectively formed on the thin metal piece 100 by the processes illustrated in FIGS. 2 to 5, passive devices are manufactured on a polymer layer 150 or a metal surface. Referring to FIG. 9, passive devices such as a transmission line 210, a capacitor 220, a resistor 230 are formed on the polymer layer 150 using a semiconductor manufacturing process. A capacitor 240 can be also directly manufactured on the exposed metal surface using the anodization method.

Through these processes, inductors 190 and vias 110 of high quality can be easily formed on the thin metal piece 100. The thin metal piece where the passive devices are integrated can be connected with and stacked on another thin metal piece, another IPD, or RF (radio frequency) chip (not shown) using an interconnection via 110.

FIG. 10 is a sectional view of a semiconductor package that uses a thin metal piece according to a fourth embodiment of the present invention.

Passive devices 210 to 240 required for realizing a system are integrated on a polymer layer 150 or a metal surface, and semiconductor devices 250 in a bare-chip state are connected with the integrated passive devices 210 to 240 using the flip-chip bonding.

At this point, the semiconductor devices 250 can be fixed on the thin metal piece 100 using a thermal conductive adhesive material 260 so that heat can be effectively emitted, and the semiconductor devices can be also connected to the passive devices 210 to 240 formed on the thin metal piece or the polymer layer 150 using a wire-bonding 251.

The thin metal piece where the passive devices are integrated can be easily connected with and stacked on another TPD or RF chip (not shown) using an interconnection via 110.

Also, for the surface-mounting on other substrates such as a PCB, the thin metal piece can also form solder bumps 200 of a BGA or an LGA type through the interconnection via 110 instead of being stacked on another IPD or RF chip.

In that case, if the solder bumps 200 are not to be formed right blow the interconnection vias 110, a redistribution layer 500 is formed as illustrated in FIG. 5.

In the meantime, a metal cover 300 is connected with the thin metal piece 100 using an adhesive layer 280 that uses a conductive epoxy or a metal-to-metal bonding in order to protect the passive devices and the semiconductor devices manufactured using the thin metal piece 100.

Also, when the metal cover 300 is connected with the semiconductor device 250 using a thermal conductive adhesive material 270, heat emission is improved. Here, for protection of the devices, a plastic molding such as encapsulating molding compound (EMC) can be used instead of the metal cover 300 and the adhesive materials 270 and 280.

As described above, the method for manufacturing the passive devices and the semiconductor packages using the thin metal piece manufactures the passive devices required for the system construction on the polymer layer, and bonds the semiconductor devices in a bare-chip state on the thin metal piece using the flip-chip bonding or the wire-bonding, so that heat can be effectively emitted and the passive devices having excellent electrical property even in the ultrahigh frequency waves can be selectively integrated. Further, since system parts are incorporated into one package and the passive devices are integrated in an inside of the package, a low price, small-sizing, lightweight of the system can be achieved.

It will be apparent to those skilled in the art that various modifications and variations can be made in the present invention. Thus, it is intended that the present invention covers the modifications and variations of this invention provided they come within the scope of the appended claims and their equivalents.

The invention claimed is:

1. A method for manufacturing passive devices in an integration manner, the method comprising the steps of:
    forming an adhesive layer on a dummy substrate; bonding a thin metal sheet on the adhesive layer so that said thin metal sheet overlies the adhesive layer;
    attaching a masking material on a backside of the thin metal sheet, patterning regions where the passive devices are to be formed, and forming insulators at a predetermined depth in a predetermined regions of the thin metal sheet;
    removing the masking material, forming metal pads on the backside of the thin metal sheet using photolithograph;
    attaching the formed device to a lower substrate by using the metal pads;
    removing the adhesive layer and the dummy substrate;
    removing metal of an upper surface of the thin metal sheet until the insulators are exposed; and
    thereafter forming solder bumps on at least one exposed portion of the thin metal sheet.

2. The method of claim 1, wherein the masking material is one of $SiO_2$, $SiN_x$, and SiO/SiN composite.

3. The method of claim 1, wherein the step of removing the metal removes the metal of the upper surface of the thin metal sheet using a mechanical lapping/polishing, a chemical etching, or a mechanical/chemical composite etching.

4. The method of claim 1, wherein the solder bumps are formed in the type of a BGA/LGA (ball grid array/land grid array) through plating or a silk screen method.

5. The method of claim 1, wherein the dummy substrate is a substrate having excellent flatness including a glass plate or a silicon semiconductor substrate.

6. The method of claim 1, wherein if a thick metal piece is used, the steps of forming the adhesive layer and bonding the thin metal sheet are omitted.

7. The method of claim 1, wherein if a thick metal piece is used, the passive devices of a structure without the lower substrate are manufactured.

* * * * *

UNITED STATES PATENT AND TRADEMARK OFFICE
CERTIFICATE OF CORRECTION

PATENT NO. : 7,838,380 B2  
APPLICATION NO. : 12/695449  
DATED : November 23, 2010  
INVENTOR(S) : Young-Se Kwon et al.

Page 1 of 1

It is certified that error appears in the above-identified patent and that said Letters Patent is hereby corrected as shown below:

Title Page, item (73) should read;
Assignee: WAVENICS INC., DAEJEON (KR)
KOREA ADVANCED INSTITUTE OF SCIENCE AND TECHNOLOGY, DAEJEON (KR)

Signed and Sealed this
Sixth Day of March, 2012

David J. Kappos
*Director of the United States Patent and Trademark Office*